United States Patent [19]
Lin et al.

[11] Patent Number: 6,165,830
[45] Date of Patent: Dec. 26, 2000

[54] METHOD TO DECREASE CAPACITANCE DEPLETION, FOR A DRAM CAPACITOR, VIA SELECTIVE DEPOSITION OF A DOPED POLYSILICON LAYER ON A SELECTIVELY FORMED HEMISPHERICAL GRAIN SILICON LAYER

[75] Inventors: Dahcheng Lin, Hsinchu; Jung-Ho Chang, Uen-Lin; Hsi-Chuan Chen, Tainan, all of Taiwan

[73] Assignee: Vanguard International Semiconductor Corporation, Hsin-Chu, Taiwan

[21] Appl. No.: 09/184,343

[22] Filed: Nov. 2, 1998

[51] Int. Cl.[7] .............................................. H01L 21/8234
[52] U.S. Cl. .......................... 438/238; 438/255; 438/254; 438/398; 438/397; 438/256
[58] Field of Search ..................... 438/255, 254, 438/398, 238

[56] References Cited

U.S. PATENT DOCUMENTS

| | | | |
|---|---|---|---|
| 5,278,091 | 1/1994 | Fazan et al. | 437/52 |
| 5,340,765 | 8/1994 | Dennison et al. | 437/52 |
| 5,612,558 | 3/1997 | Harshfield | 257/298 |
| 5,650,351 | 7/1997 | Wu | 437/52 |
| 5,696,014 | 12/1997 | Figura | 437/52 |
| 5,753,558 | 5/1998 | Akram et al. | 438/386 |
| 5,753,559 | 5/1998 | Yew et al. | 438/398 |
| 5,837,582 | 11/1998 | Su | 438/255 |
| 5,877,052 | 3/1999 | Lin et al. | 438/238 |
| 5,913,119 | 6/1999 | Lin et al. | 438/255 |

*Primary Examiner*—David Nelms
*Assistant Examiner*—Phuc Dang
*Attorney, Agent, or Firm*—George O. Saile; Stephen B. Ackerman

[57] ABSTRACT

A process for creating a DRAM capacitor structure, featuring a doped polysilicon layer, overlying a crown shaped storage node electrode, has been developed. The process features the use of an HSG silicon layer, on a doped amorphous silicon, storage node shape, with the HSG silicon layer supplying increased surface area, and thus increased capacitance, for the DRAM capacitor. A doped polysilicon layer, selectively deposited on the underlying HSG silicon layer, supplies additional dopant to the HSG silicon layer, residing on the doped amorphous silicon, storage node shape, thus minimizing a capacitance depletion phenomena, that can be present with lightly doped storage node structures.

18 Claims, 5 Drawing Sheets

METHOD TO DECREASE CAPACITANCE DEPLETION, FOR A DRAM CAPACITOR, VIA SELECTIVE DEPOSITION OF A DOPED POLYSILICON LAYER ON A SELECTIVELY FORMED HEMISPHERICAL GRAIN SILICON LAYER

BACKGROUND OF THE INVENTION (1) Field of the Invention

The present invention relates to a method used to fabricate a capacitor structure, for a dynamic random access memory, (DRAM), device, and more specifically a method of fabricating a storage node electrode, for a crown shaped, DRAM capacitor structure, optimizing surface area, and minimizing capacitance depletion.

(2) Description of the Prior Art

The use of hemispherical grain, (HSG), silicon layer, as the surface layer of a storage node electrode, has allowed increases in DRAM cell capacitance to be realized. The concave and convex features of the HSG silicon layer, result in surface area increases, when compared to counterparts fabricated with smooth surfaces. The attainment of a HSG silicon layer usually features the formation of HSG silicon seeds, on a silicon storage node shape, followed by an anneal cycle, used to grow the HSG silicon layer, via consumption of the HSG silicon seeds and a top portion of the underlying silicon storage node shape. In order to enhance the formation of the HSG silicon layer, an undoped, or lightly doped, silicon storage node shape is preferred. However the use of undoped, or lightly doped, silicon storage node shapes, result in undoped, or lightly doped HSG silicon layers, which can result in a performance degrading, capacitance depletion phenomena, thus negated the capacitance benefits arrived at via the use of the increased surface area of the HSG silicon layer.

Methods used to solve the capacitance depletion phenomena, resulting from the formation of HSG silicon layers, using undoped, or lightly doped, silicon storage node shapes, have been either a phosphorous ion implantation, into the HSG silicon layer, or a phosphine anneal procedure, applied to the HSG silicon layer. A shortcoming of the phosphorous ion implantation procedure, is the anisotropic nature of this procedure, limiting the level of dopant in the convex and concave features of the HSG silicon layer. The use of phosphine annealing, results in a phosphorous rich layer, at the surface of the HSG silicon layer, and can result in the formation of a $P_2O_5$ layer at the surface of the HSG silicon layer, when exposed to air, with the formation of the $P_2O_5$ layer depleting the phosphorous concentration in the HSG layer.

This invention will offer a procedure for doping of the HSG silicon layer, via selective deposition of a doped polysilicon layer, only on the HSG silicon layer, which is located as the top layer of a storage node shape. The selectively deposited, doped polysilicon layer, can be deposited, in situ, in the same UHV system, or in situ, in the same chamber of a cluster tool, used for the selective formation of the HSG silicon layer, on an underlying amorphous silicon, storage node shape. Prior art, such as Akram et al, in U.S. Pat. No. 5,753,558, or Dennison et al, in U.S. Pat. No. 5,340,765, describe processes used to create HSG silicon layers, but none of the prior arts describe the use of a selectively deposited, doped polysilicon layer, on an underlying HSG silicon layer, used to reduce the capacitance depletion phenomena, arising from lightly doped, HSG silicon layers.

SUMMARY OF THE INVENTION

It is an object of this invention to create a DRAM capacitor structure, in which a capacitance increase is achieved by increasing the surface area of the storage node electrode, via the use of a hemispherical grain, (HSG), silicon layer, residing on the surface of an amorphous silicon storage node shape.

It is another object of this invention to selectively grow the HSG silicon seeds, and to form the HSG silicon layer, only on the amorphous silicon storage node shape.

It is yet another object of this invention to selectively deposit a doped polysilicon layer on the top surface of the HSG silicon layer, to supply dopant to the underlying HSG silicon layer, to decrease a DRAM capacitance depletion phenomena.

In accordance with the present invention a method for fabricating a DRAM capacitor structure, with increased capacitance realized via the use of a HSG silicon layer, selectively formed on an amorphous silicon storage node shape, and decreased capacitance depletion, as a result of a doped polysilicon layer, selectively grown on the HSG silicon layer, has been developed. A transfer gate transistor comprised of: a thin gate insulator; a polysilicon gate structure; a lightly doped source/drain region; insulator spacers on the sidewalls of the polysilicon gate structure; and heavily doped source/drain region; are formed on a semiconductor substrate. A composite insulator layer is deposited on the transfer gate transistor, followed by the creation of a storage node contact hole, in the composite insulator layer, exposing a source region, of a transfer gate transistor. A doped polysilicon plug is formed in the storage node contact hole, contacting the source region of the transfer gate transistor. After deposition of an insulator layer, a hole opening is made in the insulator layer, exposing the top surface of a polysilicon plug, as well as a portion of the top surface of the underlying composite insulator layer. An amorphous silicon layer is next deposited, followed by a chemical mechanical polishing procedure, used to remove the amorphous silicon layer, from the top surface of the insulator layer. Selective removal of the insulator layer, results in a crown shaped, amorphous silicon storage node shape, comprised of two vertical, amorphous silicon layer features, formerly on the sides of the hole opening, connected to a horizontal, amorphous silicon layer, with the horizontal feature of the amorphous silicon layer, overlying and contacting the doped polysilicon plug, in the storage node contact hole. After a pre-clean procedure, HSG silicon seeds are selectively formed on the exposed surfaces of the amorphous silicon, storage node shape. An in situ, anneal procedure, is next used to create a HSG silicon layer, from the HSG silicon seeds, and from a portion of the underlying, amorphous silicon, storage node shape. A doped polysilicon layer, is next selectively deposited on the surface of the HSG silicon layer, resulting in a crown shaped, storage node electrode, comprised of a doped polysilicon layer on a HSG silicon layer, residing on an underlying amorphous silicon storage node shape. A capacitor dielectric layer is formed on the surface of the crown shaped storage node electrode, followed by the creation of an upper polysilicon electrode, completing the formation of the DRAM capacitor structure.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming a DRAM capacitor structure, featuring a storage node electrode, comprised of a doped polysilicon layer, selectively formed on an HSG silicon layer, which in turn was selectively formed on the exposed surfaces of a amorphous silicon, storage node shape, will now be described. The transfer gate transistor, used for the DRAM device, of this invention, will be an N channel device. However this invention, using a selectively formed, doped polysilicon layer, and a selectively formed HSG silicon layer, on the exposed surfaces of an amorphous silicon, storage node shape, can also be applied to P channel, transfer gate transistor. In addition this invention, described using a crown shaped, storage node electrode, can also be applied to any shape, storage node electrode.

Figure 1:
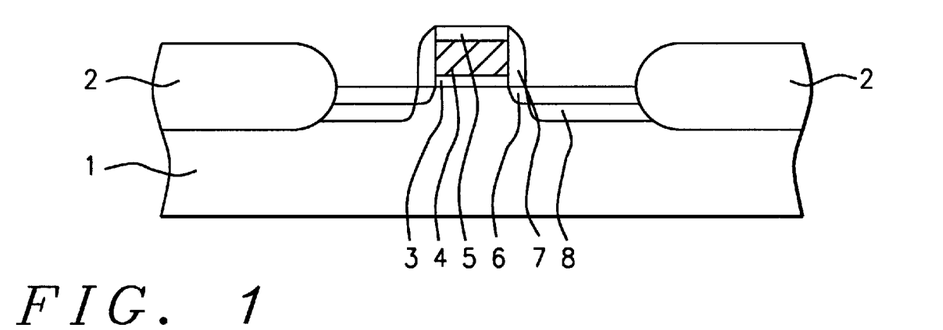
FIGS. 1–11, which schematically, in cross-sectional style, shows the key fabrication stages used in the creation of a DRAM capacitor structure, in which the storage node electrode is comprised of a doped polysilicon layer, selectively formed on a HSG silicon layer, which in turn was selectively formed on an underlying, amorphous silicon storage node shape.

Referring to FIG. 1, a P type, semiconductor substrate 1, is used. Field oxide, (FOX), regions 2, are formed for purposes of isolation. Briefly FOX regions 2, are formed via thermal oxidation of regions of semiconductor substrate 1, not protected by an oxidation resistant mask, such as silicon nitride. The silicon dioxide FOX regions are thermally grown in an oxygen—steam ambient, to a thickness between about 2000 to 5000 Angstroms. After growth of the FOX regions, the oxidation resistant mask is removed, exposing the region of the semiconductor substrate to be used as the active device region. If desired, shallow trench isolation, (STI), regions can be used in place of FOX regions 2, for purposes of isolation. STI regions are formed via forming a shallow trench, to a depth between about 2500 to 4000 Angstroms, in semiconductor substrate 1, via conventional photolithographic, and anisotropic reactive ion etching, (RIE), procedures, using $Cl_2$ as an etchant. After removal of the photoresist shape, used as a mask for shallow trench patterning, an insulator layer, such as silicon oxide, is deposited, completely filling the shallow trench. A chemical mechanical polishing, (CMP), or a selective RIE procedure, is then used to remove unwanted regions of the insulator layer, resulting in the insulator filled, shallow trench isolation regions.

After a series of wet cleans, a gate insulator layer 3, comprised of silicon dioxide, is thermally grown in an oxygen-steam ambient, at a temperature between about 750 to 1050° C., to a thickness between about 40 to 200 Angstroms. A first polysilicon layer 4, is next deposited using LPCVD procedures, at a temperature between about 500 to 700° C., to a thickness between about 500 to 4000 Angstroms. The polysilicon layer can either be grown intrinsically and doped via ion implantation of arsenic or phosphorous, or polysilicon layer 4, can be in situ doped during deposition via the incorporation of either arsine or phosphine to the silane, or disilane ambient. If lower word line, or gate resistance is desired, polysilicon layer 4, can be replaced by a polycide layer, comprised of a metal silicide layer, such as tungsten silicide or titanium silicide, residing on an underlying doped polysilicon layer. A silicon oxide layer 5, used as a cap insulator layer, is next grown via low pressure chemical vapor deposition, (LPCVD), or via plasma enhanced chemical vapor deposition, (PECVD) procedures, to a thickness between about 600 to 2000 Angstroms. Conventional photolithographic and RIE procedures, using $CHF_3$ as an etchant for silicon oxide layer 5, and using $Cl_2$ as an etchant for polysilicon or polycide layer 4, are used to create polysilicon gate structure 4, shown schematically in FIG. 1. Removal of the photoresist layer, used as an etch mask for gate structure definition, is accomplished using plasma oxygen ashing and careful wet cleans.

A lightly doped source/drain region 6, is next formed via ion implantation of phosphorous, at an energy between about 5 to 60 KeV, at a dose between about 1E13 to 1E15 atoms/$cm^2$. Another silicon oxide layer is then deposited, using either LPCVD or PECVD procedures, at a temperature between about 400 to 850° C., to a thickness between about 1500 to 4000 Angstroms, followed by an anisotropic RIE procedure, using $CHF_3$ as an etchant, creating insulator spacers 7, located on the sides of polysilicon gate structure 4. A heavily doped source/drain region 8, is then formed via ion implantation of arsenic, at an energy between about 30 to 100 KeV,at a dose between about 1E14 to 5E16 atoms/$cm^2$. The result of these procedures are again schematically shown in FIG. 1.

Figure 2:
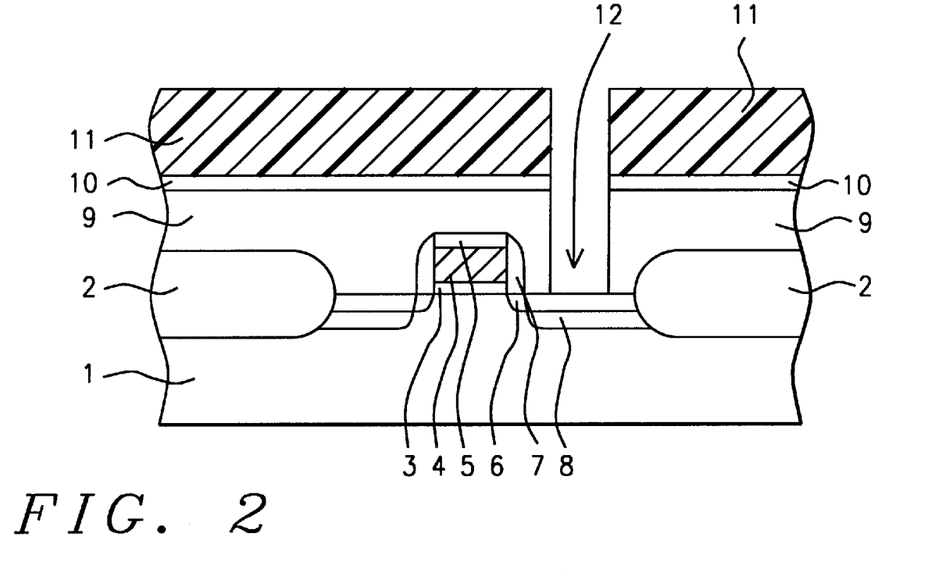

An insulator layer 9, of either silicon oxide, or borophosphosilicate glass, (BPSG), is next deposited via LPCVD or PECVD procedures, to a thickness between about 1000 to 5000 Angstroms. A CMP procedure is next used to planarize insulator layer 9. If a BPSG layer is used, a reflow procedure, performed at a temperature between about 700 to 1000° C., is employed to create a smoother the top surface topography for the BPSG layer. A silicon nitride layer 10, is next deposited, via LPCVD or PECVD procedures, to a thickness between about 50 to 1000 Angstroms. Conventional photolithographic and RIE procedures, using photoresist shape 11, as a mask, and using $CF_4$ as an etchant for silicon nitride layer 10, and $CHF_3$ as an etchant for silicon oxide layer 9, result in the creation of storage node contact hole 12, in the composite insulator layer, exposing the top surface of the source region, in heavily doped source/drain regions 8. This is schematically shown in FIG. 2. Removal of photoresist shape 11, used as an etch mask for the creation of storage node contact hole 12, is performed via use of plasma oxygen ashing and careful wet cleans.

Figure 3:
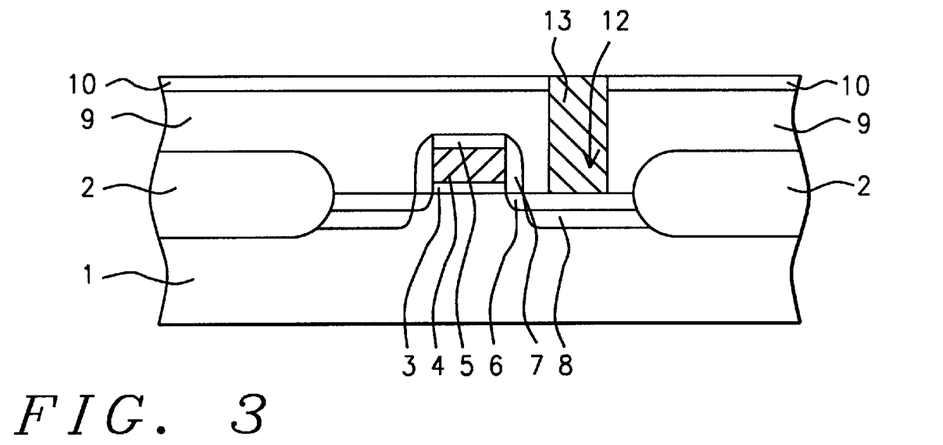

A polysilicon layer is next deposited, using LPCVD procedures, at a thickness between about 1000 to 6000 Angstroms. The polysilicon layer is in situ doped, during deposition, via the addition of arsine, or phosphine, to a silane or disilane ambient, resulting in a bulk concentration for the polysilicon layer, between about 1E19 to 2E20 atoms/$cm^3$. The formation of doped polysilicon plugs 13, in storage node contact hole 12, shown schematically in FIG. 3, is accomplished via removal of unwanted polysilicon, from the top surface of silicon nitride layer 10, using either an anisotropic RIE procedure, using $Cl_2$ as an etchant, or using a CMP procedure.

Figure 4:
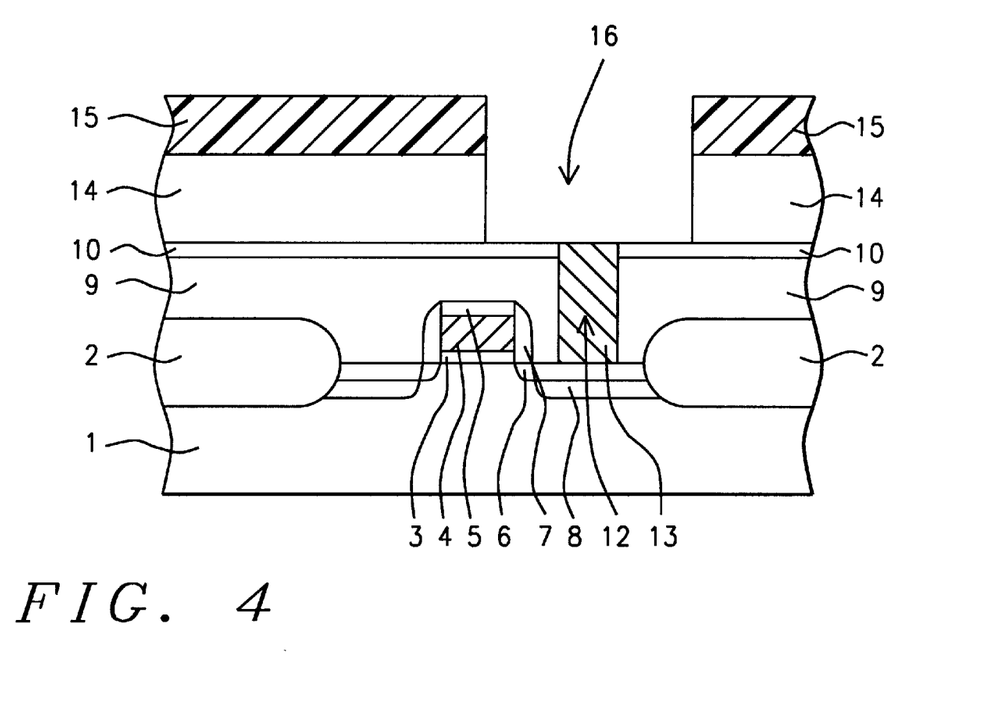

The insulator shapes that will be used to form a subsequent crown shaped storage node electrode are next addressed, and described schematically in FIG. 4. A silicon oxide layer 14, is deposited using LPCVD or PECVD procedures, to a thickness between about 4000 to 20000 Angstroms. A boro-phosphosilicate glass, (BPSG). layer, can also be used, in place of silicon oxide. Photoresist shape 15, is next formed on the top surface of the silicon oxide layer 14, and used as a mask to allow an anisotropic RIE procedure, using $CHF_3$ as an etchant, to create opening 16, in silicon oxide layer 14. Opening 16, exposes the top surface of doped polysilicon plug 13, as well as exposing a portion of the top surface of silicon nitride layer 10. The height, or thickness, of silicon oxide layer 14, will subsequently determine the height of amorphous silicon, vertical features, used as a component of a crown shaped storage node electrode.

Figure 5:
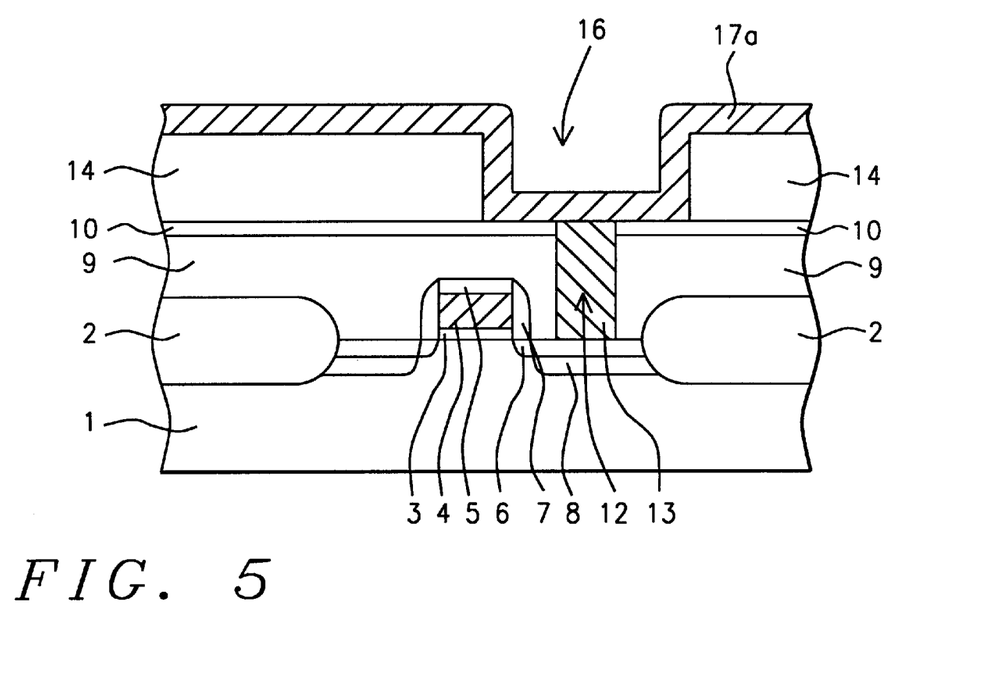

After removal of photoresist shape 15, via plasma oxygen ashing and careful wet cleans, an amorphous silicon layer 17a, is deposited via LPCVD procedures, at a temperature below 550° C., to a thickness between about 300 to 2000 Angstroms. Amorphous silicon layer 17a, schematically shown in FIG. 5, resides on the exposed surfaces of opening 16, including overlying and contacting the top surface of doped polysilicon plug 13. Amorphous silicon layer 17a, is doped in situ, during deposition, via the addition of phosphine, to a silane, or to a disilane ambient, resulting in a bulk concentration below 6E20 atoms/cm$^3$. This low doping level will allow the selective formation of silicon seeds, to be occur on exposed, amorphous silicon surfaces. If amorphous silicon layer 17a, were deposited, incorporating a higher doping level, selective formation of silicon seeds, on the higher doped surface, would be difficult to achieve.

Figure 6:
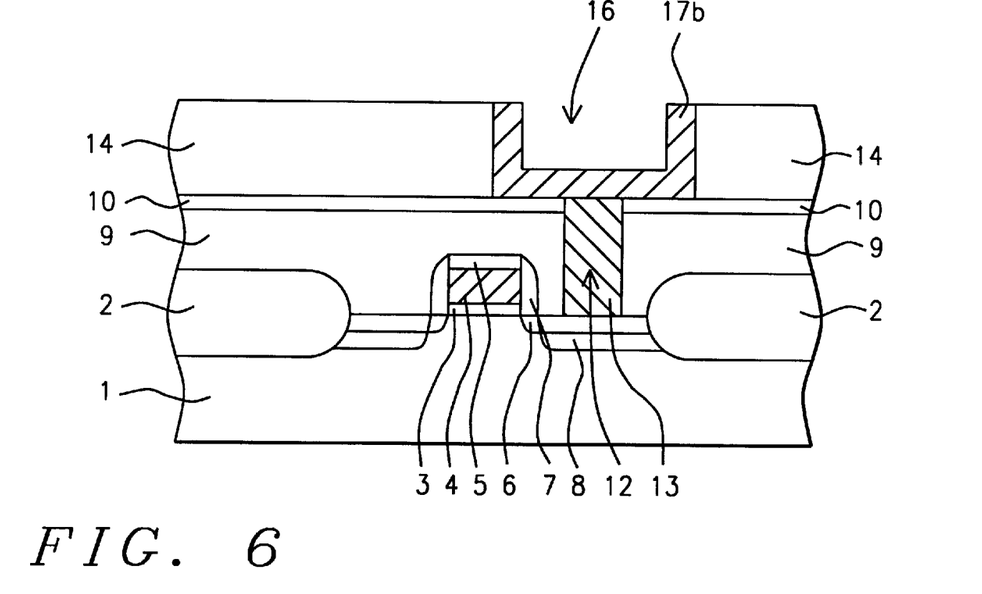
Figure 7:
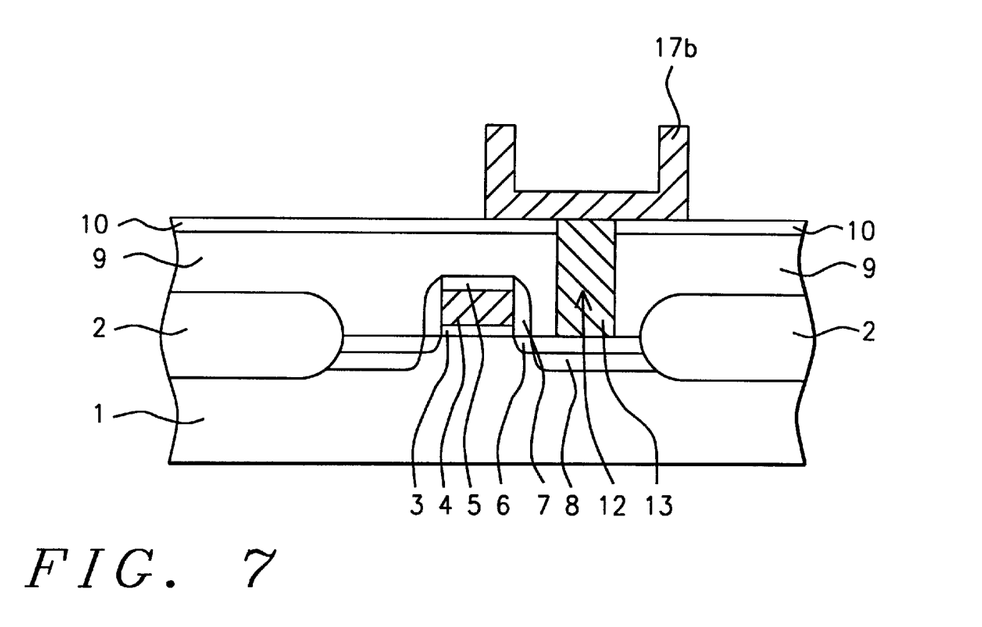

A chemical mechanical polishing, (CMP), procedure is next employed, removing the regions of amorphous silicon layer 17a, from the top surface of silicon oxide layer 14, resulting in the creation of a crown shaped, amorphous silicon, storage node shape 17b, in opening 16. This is schematically shown in FIG. 6. The exposure of the top surface of silicon oxide layer 14, resulting from the CMP procedure, allows a wet etch procedure, using a hydrofluoric, (HF), acid solution, or a HF vapor procedure, to selectively remove silicon oxide, or BPSG layer 14, resulting in crown shape, amorphous silicon, storage node shape 17b, comprised of two amorphous silicon vertical features, connected by a amorphous silicon horizontal feature. The horizontal feature, of crown shaped, amorphous silicon, storage node shape 17b, overlays and contacts, doped polysilicon plug 13, located in storage node contact hole 12. This is schematically shown in FIG. 7. Of importance is that the exposed surfaces of crown shaped, amorphous silicon, storage node shape 17b, are comprised of a doped, amorphous silicon layer, allowing subsequent silicon seeding, to selectively form on these surfaces.

Figure 8:
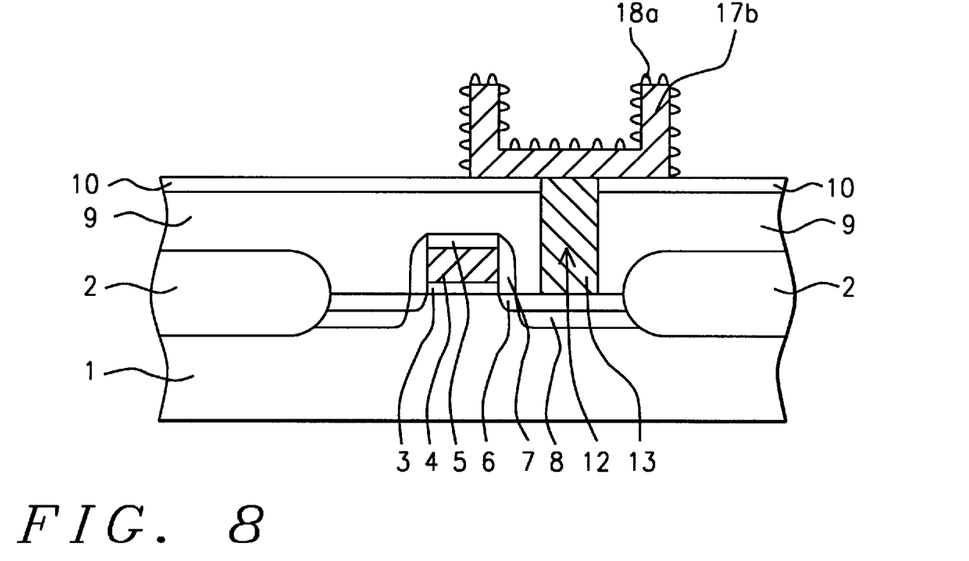
Figure 9:
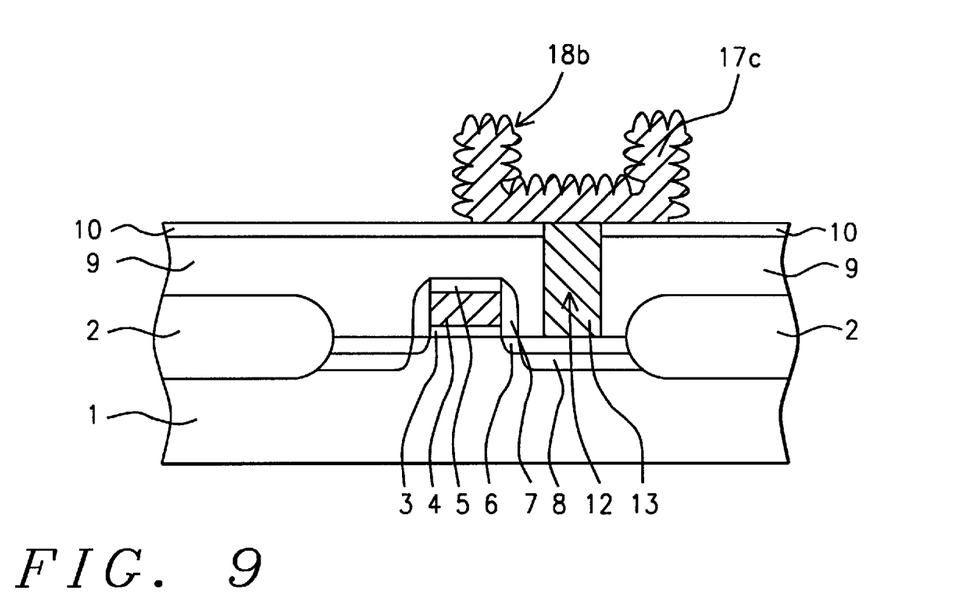

A pre-clean procedure, performed using a buffered hydrofluoric acid solution, is next used to remove native oxide from the surfaces of crown shaped, amorphous silicon, storage node shape. Another method of accomplishing native oxide removal is exposure, in a ultra high vacuum, (UHV), system, at a temperature between about 500 to 800° C., at a pressure below 1E-8 torr. Next HSG silicon seeds 18a, shown schematically in FIG. 8, are selectively formed, only on the surface of crown shaped, amorphous silicon, storage node shape 17b, in situ, in the UHV system. The selective deposition of HSG silicon seeds 18a, is accomplished, in situ, in the UHV system, at a temperature between about 500 to 800° C., at a pressure less than 1 torr, using silane, or disilane, as a source, or silane or disilane, diluted in a helium ambient. An anneal procedure, performed at a temperature between about 500 to 800° C., at a pressure less than 1.0 torr, in a nitrogen ambient, again performed in situ, in the UHV system, is then used to convert HSG silicon seeds 18a, to HSG silicon layer 18b, shown schematically in FIG. 9, forming crown shaped, storage node electrode 17c. The convex and concave features of HSG silicon layer 18b, are comprised of HSG silicon with a grain size between about 200 to 800 Angstroms.

Figure 10:
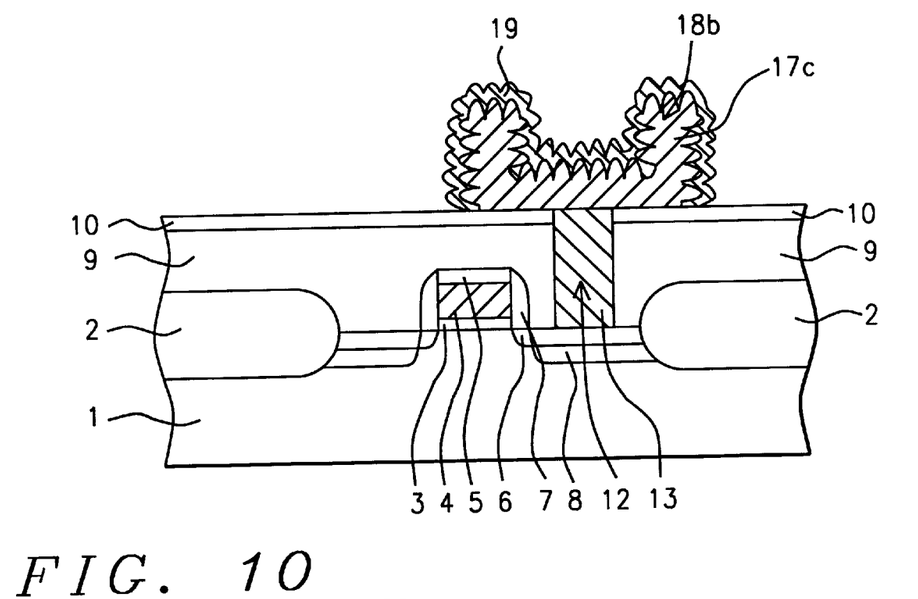

Crown shaped, storage node electrode 17c, although now comprised with HSG silicon layer 18b, offering increased capacitance as a result of the increase in surface area, still will not offer optimum performance due to the low dopant concentration of the HSG silicon layer, which was doped via diffusion from the underlying, amorphous silicon, storage node shape 17b, comprised with the doped amorphous silicon layer. Therefore an overlying, doped polysilicon layer 19, is selectively deposited, only on exposed HSG silicon layer 18b, of crown shaped, storage node electrode 17c. The deposition of doped polysilicon layer 19, is accomplished in situ, in the UHV system. If the HSG seeding and anneal procedures, were performed in a chamber of a cluster tool, doped polysilicon layer 19, would also be selectively deposited in a chamber of the cluster tool, without exposure to air between HSG silicon and doped polysilicon deposition steps. Doped polysilicon layer 19, shown schematically in FIG. 10, is selectively deposited on HSG silicon layer 18b, at a temperature between about 500 to 800° C., to a thickness less then 100 Angstroms, and in situ doped, during deposition via the addition of phosphine, or arsine, to a silane or to a disilane ambient, resulting in bulk concentration of about 3E20 atoms/cm$^3$. Outdiffusion from doped polysilicon layer 19, during deposition, and during subsequent heat cycles, such as the processes and temperatures used to convert the HSG seeds to the HSG silicon layer, as well as the process and temperature used to form a subsequent capacitor dielectric layer, result in the desired doping of HSG silicon layer 18b, thus minimizing the capacitance depletion phenomena, which would have been evidenced with lighter doped HSG silicon layers.

Figure 11:
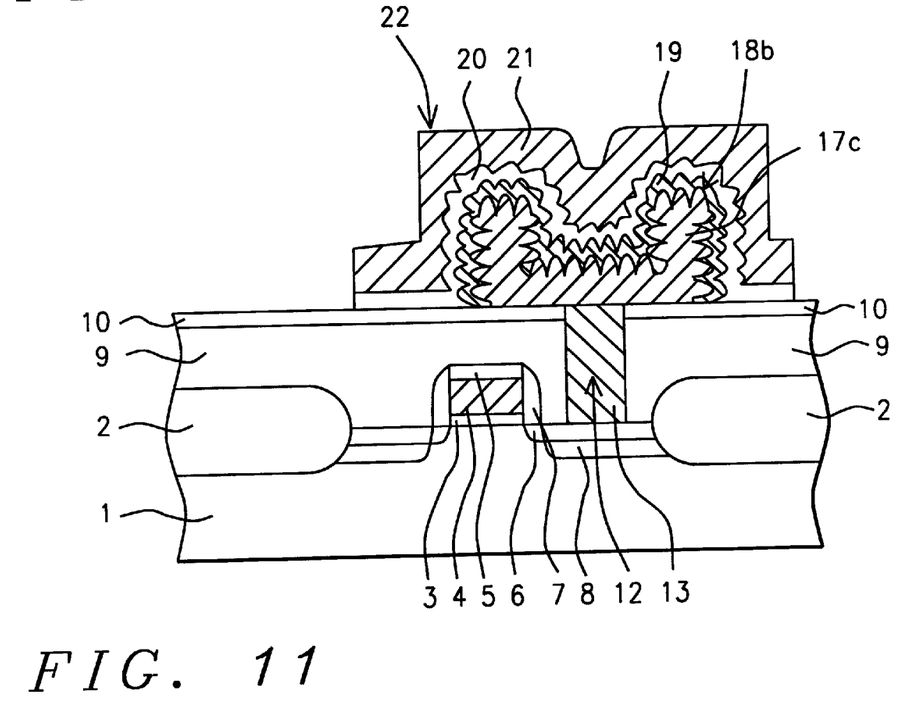

The completion of DRAM capacitor structure 22, featuring crown shaped storage node electrode 17c, comprised with HSG silicon layer 18b, is next addressed, and schematically shown in FIG. 11. A capacitor dielectric layer 20, such as ONO, (Oxidized—silicon Nitride—silicon Oxide), is next formed on crown shaped storage node electrode 19b. The ONO layer is formed by initially growing a silicon dioxide layer, between about 10 to 50 Angstroms, followed by the deposition of a silicon nitride layer, between about 10 to 60 Angstroms. Subsequent thermal oxidation of the silicon nitride layer results in the formation of a silicon oxynitride layer on silicon oxide, at a silicon oxide equivalent thickness of between about 40 to 80 Angstroms. The temperature of the thermal oxidation of silicon nitride, between about 700 to 1100° C., also allows doped polysilicon layer 19, to dope underlying HSG silicon layer 18b. If desired a nitride oxide, (NO), or a $Ta_2O_5$, capacitor dielectric layer can be used, with diffusion of dopant from doped polysilicon layer 19, to HSG silicon layer 18b, resulting during the formation of these capacitor dielectric layers, or via a separate anneal cycle. Finally another layer of polysilicon is deposited, via LPCVD procedures, to a thickness between about 1000 to 2000 Angstroms. Doping of this polysilicon layer is accomplished using an in situ doping, deposition procedure, via the addition of phosphine to a silane ambient. Photolithographic and RIE procedures, using $Cl_2$ as an etchant, are next employed to create polysilicon upper electrode, or plate electrode 21, shown schematically in FIG. 11. Photoresist is again removed via plasma oxygen ashing and careful wet cleans.

While this invention has been particularly shown and described with reference to the preferred embodiments thereof, it will be understood by those skilled in the art that various changes in form and details may be without departing from the spirit and scope of invention.

What is claimed is:

1. A method of fabricating a capacitor structure, for a dynamic random access memory, (DRAM), device, on a semiconductor substrate, comprising the steps of:

providing an underlying transfer gate transistor, comprised of a gate structure, on a gate insulator layer, insulator spacers on the sides of said gate structure, and a source/drain region in an area of said semiconductor substrate, not covered by said gate structure;

forming a storage node contact hole, in a composite insulator layer, exposing the top surface of a source region;

forming a doped polysilicon plug, in said storage node contact hole;

forming an opening in a thick insulator layer, exposing a portion of the top surface of said composite insulator layer, and exposing the top surface of said doped polysilicon plug;

depositing a doped amorphous silicon layer;

removing said doped amorphous silicon layer from the top surface of said thick insulator layer, creating an amorphous silicon, storage node shape, in said opening, in said insulator layer;

removing said thick insulator layer, resulting in the formation of a crown shaped, amorphous silicon, storage node shape, comprised of vertical shaped of said doped amorphous silicon layer, with said vertical shapes of said doped amorphous silicon layer, connected to a horizontal shape, of said doped amorphous silicon layer, and with said horizontal shape of said doped amorphous silicon layer, overlying and contacting, said doped polysilicon plug;

performing a pre-clean procedure, to remove native oxide from the exposed surfaces of said doped amorphous silicon layer, of said crown shaped, amorphous silicon, storage node shape;

selectively forming hemispherical grain, (HSG), silicon seeds, on the surfaces of said doped amorphous silicon layer, of said crown shaped, amorphous silicon, storage node shape;

annealing to convert said HSG silicon seeds, to a HSG silicon layer, resulting in a crown shaped, storage node electrode, comprised of said HSG silicon layer, on said crown shaped, amorphous silicon, storage node shape;

selectively depositing a doped polysilicon layer, on said HSG silicon layer, of said crown shaped, storage node electrode;

forming a capacitor dielectric layer on said doped polysilicon, of said crown shaped, storage node electrode, resulting in dopant from said doped polysilicon layer, diffusing into said HSG silicon layer, during the formation of said capacitor dielectric layer; and forming an upper plate electrode, for said capacitor structure.

2. The method of claim 1, wherein said doped polysilicon plug is formed from a polysilicon layer, obtained using LPCVD procedures, to a thickness between about 1000 to 6000 Angstroms, and in situ doped during deposition, via the addition of phosphine or arsine, to a silane ambient, resulting in a bulk concentration for said doped polysilicon plug between about 1E19 to 2E20 atoms/cm$^3$.

3. The method of claim 1, wherein said thick insulator layer is a silicon oxide layer, obtained via LPCVD or PECVD procedures, to a thickness between about 4000 to 20000 Angstroms.

4. The method of claim 1, wherein said thick insulator layer is a boro-phosphosilicate glass, (BPSG), layer, deposited using LPCVD or PECVD procedures, to a thickness between about 4000 to 20000 Angstroms.

5. The method of claim 1, wherein said opening, in said insulator layer, is formed via an anisotropic RIE procedure, using $CHF_3$ as an etchant.

6. The method of claim 1, wherein said doped amorphous silicon layer is obtained using LPCVD procedures, at a temperature below 550° C., to a thickness between about 300 to 2000 Angstroms, and doped in situ, during deposition, via the addition of phosphine, to a silane, or to a disilane ambient, resulting in a bulk concentration below 6E20 atoms/cm$^3$.

7. The method of claim 1, wherein said HSG silicon seeds are selectively formed on said doped amorphous silicon layer, of said crown shaped, amorphous silicon, storage node shape, at a temperature between about 500 to 800° C., at a pressure less than 1 torr, using silane, or disilane, in a helium ambient.

8. The method of claim 1, wherein said HSG silicon layer is formed, from said HSG silicon seeds, via said annealing, performed at a temperature between about 500 to 800° C., at a pressure below 1 torr, in a nitrogen ambient.

9. The method of claim 1, wherein said doped polysilicon layer is selectively deposited on said HSG silicon layer, at a temperature between about 500 to 800° C., to a thickness below 100 Angstroms, and doped in situ, during deposition, via the addition of phosphine, or arsine, to a silane, or to a disilane ambient, resulting in a bulk concentration of about 3E20 atoms/cm$^3$.

10. The method of claim 1, wherein said capacitor dielectric layer is ONO, at an equivalent silicon dioxide thickness between about 40 to 80 Angstroms, created by an initial thermal oxidation to form a silicon oxide layer, at a thickness between about 10 to 50 Angstroms, followed by a deposition of silicon nitride, to a thickness between about 10 to 60 Angstroms, and thermal oxidation of said silicon nitride layer, at a temperature between about 700 to 1000° C., creating a silicon oxynitride layer, on the underlying, said silicon oxide layer, and driving dopant from said doped polysilicon layer, into said HSG silicon layer.

11. A method of fabricating a crown shaped, storage node electrode, for a DRAM capacitor structure, on a semiconductor substrate, featuring an HSG silicon layer, used to increase the surface area of the crown shaped, storage node electrode, and featuring a doped polysilicon layer, selectively deposited on said HSG silicon layer, used to dope the underlying HSG silicon layer, comprising the steps of:

providing an underlying transfer gate transistor, on said semiconductor substrate, comprised of a polysilicon gate structure, with insulator spacers on the sides of said polysilicon gate structure, overlying a silicon dioxide gate insulator layer, and a source/drain region, in an area of said semiconductor substrate, not covered by said gate structure;

depositing a composite insulator layer, comprised of an underlying silicon oxide layer, and an overlying silicon nitride layer;

forming a storage node contact hole in said composite insulator layer, exposing the top surface of the source region, of said source/drain region;

depositing a first doped polysilicon layer, completely filling said storage node contact hole;

removing said first doped polysilicon layer, from the top surface of said composite insulator layer, forming a doped polysilicon plug, in said storage node contact hole;

depositing a thick insulator layer;

forming an opening in said thick insulator layer, exposing the top surface of said doped polysilicon plug, and exposing a portion of the top surface of the silicon nitride layer, used as the overlying layer of said composite insulator layer;

depositing a doped amorphous silicon layer;

removing said doped amorphous silicon layer, from the top surface of said thick insulator layer, creating a doped, amorphous silicon, storage node shape;

removing said thick insulator layer from top surface of said composite insulator layer, resulting in a crown shaped, doped amorphous silicon, storage node shape, comprised of two doped amorphous silicon vertical shapes, connected by a doped amorphous silicon horizontal shape, with said doped amorphous silicon horizontal shape overlying and contacting said doped polysilicon plug structure;

performing a dilute hydrofluoric, (DHF), acid, pre-clean procedure, to remove native oxide from the surface of said crown shaped, doped amorphous silicon, storage node shape;

selectively depositing HSG silicon seeds, in said UHV system, on the exposed surfaces of said doped amorphous silicon layer, of said crown shaped, doped amorphous silicon, storage node shape;

performing an anneal, in situ, in said UHV system, to convert said HSG silicon seeds, to said HSG silicon layer, resulting in the formation of said crown shaped, storage node electrode, comprised of said HSG silicon layer, on said crown shaped, doped amorphous silicon, storage node shape;

selectively depositing a second heavily doped polysilicon layer, on the HSG silicon layer of said crown shaped, storage node electrode, in situ, in said UHV system;

forming a capacitor dielectric layer on said crown shaped storage node electrode, resulting in dopant from said second heavily doped polysilicon layer, diffusing into said HSG silicon layer, during the procedure used to form said capacitor dielectric layer; depositing a polysilicon layer; and patterning of said polysilicon layer to form a polysilicon upper electrode, for said DRAM capacitor structure.

12. The method of claim 11, wherein said composite insulator layer is comprised of an underlying layer of either silicon oxide, or boro-phosphosilicate glass, obtained via LPCVD or PECVD procedures, at a thickness between about 1000 to 5000 Angstroms, and is comprised of an overlying layer of silicon nitride, obtained via LPCVD or PECVD procedures, to a thickness between about 50 to 10000 Angstroms.

13. The method of claim 11, wherein said first doped polysilicon layer, used for said doped polysilicon plug, is obtained using LPCVD procedures, to a thickness between about 1000 to 6000 Angstroms, and doped in situ, during deposition, via the addition of arsine or phosphine, to a silane ambient, resulting in a bulk concentration between, of said doped polysilicon layer, between about 1E19 to 2E20 atoms/cm$^3$.

14. The method of claim 11, wherein said doped amorphous silicon layer is deposited using LPCVD procedures, at a temperature below 550° C., to a thickness between about 300 to 2000 Angstroms, and doped in situ, during deposition, via the addition of phosphine to a silane, or to a disilane ambient, resulting in a bulk concentration below about 6E20 atoms/cm$^3$.

15. The method of claim 11, wherein said DHF acid pre-clean procedure, is performed to remove native oxide from the surface of said doped amorphous silicon layer.

16. The method of claim 11, wherein said HSG silicon seeds are selectively formed, in said UHV system, at a temperature between about 500 to 800° C., at a pressure less than 1.0 torr, using silane, or disilane, or using silane, or disilane, in a helium ambient.

17. The method of claim 11, wherein said HSG silicon layer is formed from said HSG silicon seeds, via said anneal, performed in situ, in said UHV system, at a temperature between about 500 to 800° C., at a pressure below 1 torr.

18. The method of claim 11 wherein said second heavily doped polysilicon layer is selectively deposited, on said HSG silicon layer, in situ, in said UHV system, at a temperature between about 500 to 800° C., to a thickness below 100 Angstroms, and doped in situ, during deposition, via the addition of arsine, or phosphine, to a silane, or to a disilane ambient, resulting in a bulk concentration of about 3E20 atoms/cm$^3$.

* * * * *